United States Patent
Manabe et al.

(10) Patent No.: US 9,146,461 B2
(45) Date of Patent: Sep. 29, 2015

(54) METHOD OF MAKING NOZZLE CHIP

(71) Applicant: CANON KABUSHIKI KAISHA, Tokyo (JP)

(72) Inventors: Takanobu Manabe, Kawasaki (JP); Toshiaki Kurosu, Oita (JP); Makoto Watanabe, Yokohama (JP); Masataka Nagai, Yokohama (JP); Hiroyuki Murayama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/228,860

(22) Filed: Mar. 28, 2014

(65) Prior Publication Data

US 2014/0293259 A1 Oct. 2, 2014

(30) Foreign Application Priority Data

Apr. 1, 2013 (JP) ................................. 2013-075802

(51) Int. Cl.
| | |
|---|---|
| *B41J 2/14* | (2006.01) |
| *B41J 2/16* | (2006.01) |
| *B21D 51/16* | (2006.01) |
| *B21K 21/08* | (2006.01) |
| *B23P 15/16* | (2006.01) |
| *G03F 7/00* | (2006.01) |

(52) U.S. Cl.
CPC ................................... *G03F 7/0015* (2013.01)

(58) Field of Classification Search
None
See application file for complete search history.

(56) References Cited

U.S. PATENT DOCUMENTS 5,153,778 A * 10/1992 Sasian-Alvarado .......... 359/742
2010/0255424 A1 * 10/2010 Shiba et al. ................... 430/319

FOREIGN PATENT DOCUMENTS

JP 2009-166492 A 7/2009

* cited by examiner

*Primary Examiner* — Erica Lin
(74) *Attorney, Agent, or Firm* — Canon USA Inc. IP Division (57) ABSTRACT

A method of making a nozzle chip includes a step of reduction-projection-exposing a photosensitive resin material to exposure light through a mask by using a reduction-projection-exposure apparatus, the mask having a light-transmitting pattern formed thereon; and a step of forming an ejection orifice pattern corresponding to the light-transmitting pattern on the photosensitive resin material by performing a developing operation. The exposure light in the step of reduction-projection-exposing is passed through a correction mechanism before the exposure light reaches the photosensitive resin material, the correction mechanism being configured to suppress an inclination of a chief ray due to off-axis telecentricity that occurs in the reduction-projection-exposure apparatus.

9 Claims, 9 Drawing Sheets

METHOD OF MAKING NOZZLE CHIP

BACKGROUND OF THE INVENTION

1. Field of the Invention

The present invention relates to a method of making a nozzle chip.

2. Description of the Related Art

A nozzle chip is used in a liquid ejection head that ejects a liquid from ejection orifices. Examples of a liquid ejection head include an ink jet recording head that performs recording by ejecting an ink toward a recording medium such as a sheet of paper. Japanese Patent Laid-Open No. 2009-166492 describes a method of making a nozzle chip of an ink jet recording head.

The method of making a nozzle chip described in Japanese Patent Laid-Open No. 2009-166492 will be briefly described. First, an element substrate, which includes energy generating elements that generate energy for ejecting a liquid from ejection orifices, is prepared. Next, a positive photosensitive resin layer including an optical absorption agent is formed on the element substrate. Then, the positive photosensitive resin layer is exposed to light by photolithography, and thereby a pattern having the shapes of flow paths is formed. Next, a negative photosensitive resin layer, which will serve as an ejection orifice forming member, is formed so as to cover the pattern, the negative photosensitive resin layer is exposed to i-line light (wavelength 365 nm) through an exposure mask having a predetermined light transmitting pattern, and an ejection orifice row is formed by performing a developing operation. Lastly, by removing the pattern through the ejection orifices, flow paths having predetermined shapes are formed in the ejection orifice forming member.

SUMMARY OF THE INVENTION

According to an aspect of the present invention, a method of making a nozzle chip includes a step of reduction-projection-exposing a photosensitive resin material to exposure light through a mask by using a reduction-projection-exposure apparatus, the mask having a light-transmitting pattern formed thereon; and a step of forming an ejection orifice pattern corresponding to the light-transmitting pattern on the photosensitive resin material by performing a developing operation. The exposure light in the step of reduction-projection-exposing is passed through a correction mechanism before the exposure light reaches the photosensitive resin material, the correction mechanism being configured to suppress an inclination of a chief ray due to off-axis telecentricity that occurs in the reduction-projection-exposure apparatus.

By suppressing an inclination of a chief ray relative to the optical axis with the correction mechanism in a reduction-projection-exposure process, the inclination of the chief ray can be suppressed even when the chief ray is in an end portion of an exposure area. Therefore, the entirety of the exposure area can be substantially perpendicularly irradiated with exposure light. As a result, inclinations of ejection orifices formed by the exposure can be suppressed.

Further features of the present invention will become apparent from the following description of exemplary embodiments with reference to the attached drawings.

DESCRIPTION OF THE EMBODIMENTS

When exposing a negative photosensitive resin layer, which will become an ejection orifice forming member, to light by using a method described in Japanese Patent Laid-Open No. 2009-166492, a reduction-projection-exposure process can be used. The inventor found that, in this case, landing positions of droplets ejected from ejection orifices formed near an outer periphery of an exposure area may be displaced from ideal landing positions, and, as a result, the quality of recorded images (such as printed characters) may decrease.

The inventor investigated the cause of this problem and found that it occurs because, in a case where reduction-projection-exposure is performed, an inclination of a chief ray, which serves as exposure light, relative to the optical axis at a position near an end portion of an exposure area is large.

The present invention provides a method of making a nozzle chip with which displacement of droplets ejected from ejection orifices that are formed in the vicinity of an outer periphery of an exposure area can be suppressed.

The inventor examined the above problem and found that, in the reduction-projection-exposure process, the position of a nozzle chip region pattern, which is disposed on an exposure mask so as to perform patterning of nozzle chip regions, influences displacement of landing positions of droplets ejected from ejection orifices. Hereinafter, this point will be described in detail.

Figure 2:
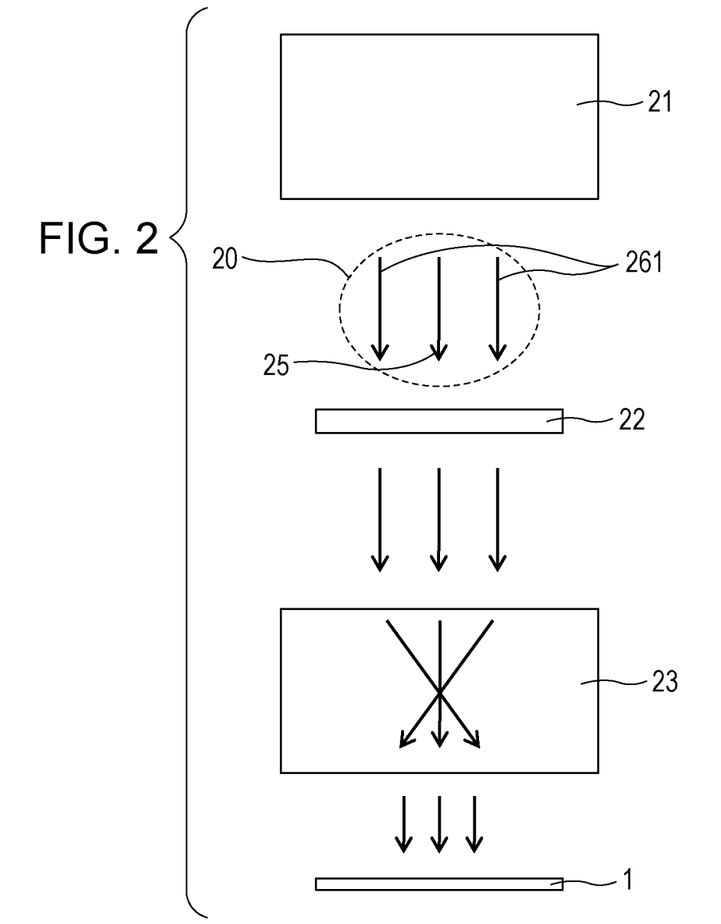
FIG. 2 is a schematic sectional view illustrating a reduction-projection-exposure process.

FIG. 2 illustrates an exposure process performed by using a reduction-projection-exposure apparatus. The reduction-projection-exposure apparatus includes an illumination optical system 21 and a reduction-projection optical system 23. The illumination optical system 21 irradiates a mask 22 with a light beam 20 emitted from a light source. The reduction-projection optical system 23 projects a light-transmitting pattern (exposure pattern) formed on the mask 22 onto a nozzle chip 1 while reducing the size of the pattern. When the center of the light beam 20 emitted from the illumination optical system 21 and the center of the mask 22 are on the same axis, a light ray 261 that passes through an outer peripheral portion of the mask 22 is incident on a surface the nozzle chip 1 at an angle that is larger than that of a light ray 25 that passes through the center of the mask 22. That is, even when the light ray 25 that passes through the center of the mask 22 is perpendicularly incident on the surface of the nozzle chip 1, the light ray 261 that passes through an outer peripheral portion of the mask 22 tends to be incident on the surface so as to be slightly inclined with respect to a direction perpendicular to the surface of the nozzle chip 1.

Thus, exposure light that passes through a part of the exposure pattern that is located in an outer peripheral portion of the mask 22 is projected onto the nozzle chip 1 at a predetermined inclination. As a result, ejection orifices on the nozzle chip 1 are also formed so as to be inclined. Droplets ejected from the inclined ejection orifices land on a recording medium at positions that are displaced from ideal positions. The present invention provides a method of making a nozzle chip which addresses such a problem.

Figure 1:
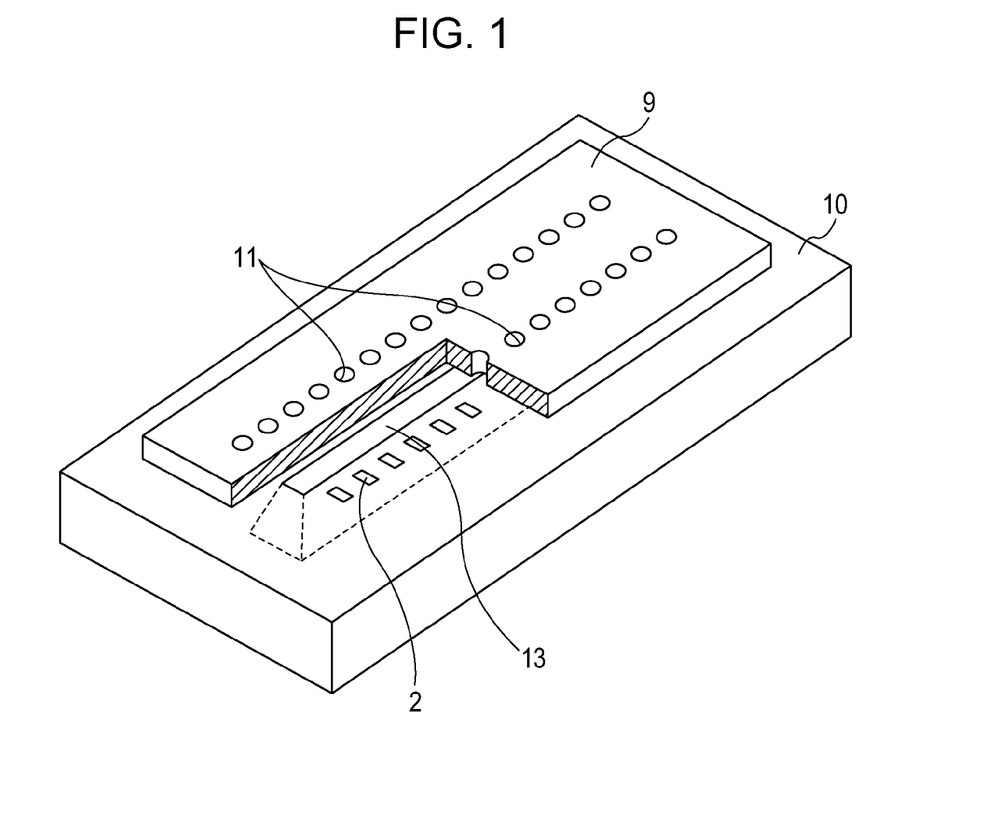
FIG. 1 is a schematic perspective view of a nozzle chip.

FIG. 1 is a schematic perspective view of a nozzle chip to be made. The nozzle chip 1 according to an embodiment includes an element substrate 10 on which energy generating elements 2 are arranged at a predetermined pitch in two rows. The energy generating elements 2 generate energy for ejecting a liquid. A liquid supply port 13, which has been formed in the element substrate 10 by anisotropic etching, has an opening between the two rows of the energy generating elements 2. An ejection orifice forming member 9 is disposed on the element substrate 10. Ejection orifices 11, which correspond to the energy generating elements 2, and liquid flow paths (not shown), through which the ejection orifices 11 are connected to the liquid supply port 13, are formed in the ejection orifice forming member 9.

The ejection orifice forming member 9 also serves to form a portion, such as a top wall, of a flow path. Therefore, high mechanical strength as a structural material, adhesion to a base member, ink resistance, and a property that enables high-resolution patterning for forming fine patterns for the ejection orifices 11 are required for the ejection orifice forming member 9. Examples of a material that satisfies such properties include a cationic polymerized epoxy resin composition. An epoxy resin is produced by, for example, a reaction between bisphenol A and epichlorohydrin or a reaction between bromo bisphenol A and epichlorohydrin. Alternatively, an epoxy resin may be produced by a reaction between phenol novolac or o-cresol novolac and epichlorohydrin. Preferably, the epoxy equivalent of the epoxy resin be 2000 or less, and more preferably 1000 or less. If the epoxy equivalent is greater than 2000, the crosslink density decreases during a curing reaction of the epoxy resin, and adhesion and ink resistance may decrease.

Examples of a photocation polymerization initiator for curing an epoxy resin include a chemical compound that generates an acid when irradiated with light. An aromatic sulfonium salt and an aromatic iodonium salt are examples of such a compound. As necessary, a wavelength sensitizer may be added. Examples of a wavelength sensitizer include "SP-100", which is marketed by ADEKA corporation.

The nozzle chip 1 illustrated in FIG. 1 is disposed so that a surface (hereinafter, referred to as an ejection surface) in which the ejection orifices 11 are formed faces a recording surface of a recording medium. The energy generating elements 2 apply energy to a liquid (such as ink), which is supplied to the flow paths through the liquid supply port 13, and thereby droplets are ejected from the ejection orifices 11. Recording is performed by making the droplets adhere to the recording medium.

Referring back to FIG. 2, the reduction-projection-exposure apparatus will be described further. Exposure can be performed by using i-line light emitted from a light source, such as a high-pressure mercury lamp. Light used for exposure is not limited to this, and any light having a wavelength to which a member subjected to patterning is photosensitive may be used.

With a reduction-projection optical system including a telecentric optical system, distortion (defocus distortion) may occur if the focus position deviates from the best focus position to a defocus position. The magnitude of distortion changes in accordance with the degree of defocusing. Regarding the present invention, the magnitude of defocus distortion of a reduction-projection optical system including a telecentric optical system will be referred to as "off-axis telecentricity". That is, off-axis telecentricity corresponds to the difference between the distortion at the best focus and the distortion at defocus. Here, the term "telecentricity" refers to the degree of parallelism between a chief ray and the optical axis of an optical system.

The absolute value of off-axis telecentricity tends to be larger for the light ray 261 in an outer part of the light beam 20 than for the light ray 25 at the center of the light beam 20. The term "the center of the light beam 20" refers to the barycenter of a cross section of the light beam 20 parallel to the mask 22. If the center of the light beam 20 coincides with (is on the same axis as) the center of the mask 22, the absolute value of off-axis telecentricity is larger for the light ray 261, which passes through an area near an edge of the mask 22, than for the light ray 25, which passes through the center of the mask 22. The same applies to the relationship between a light ray and the optical axis of the reduction-projection optical system 23, because the center of the mask 22 basically coincides with the optical axis of the reduction-projection optical system 23. Due to the influence of off-axis telecentricity, the light beam 20 emitted from the illumination optical system 21 toward the mask 22 has an inclination with respect to a direction perpendicular to a surface of the nozzle chip 1. A change in the imaging position due to distortion caused by defocusing of 1 μm is represented as follows:

$$1000 \times \tan \phi 1 \, (\text{nm}),$$

where $\phi 1$ is the inclination angle of a light ray.

Typically, a change in the imaging position is on the order of nanometers and the inclination angle $\phi 1$ is very small. Therefore, it can be assumed as follows.

$$\tan \phi 1 \approx \sin \phi 1$$

Figure 3A:
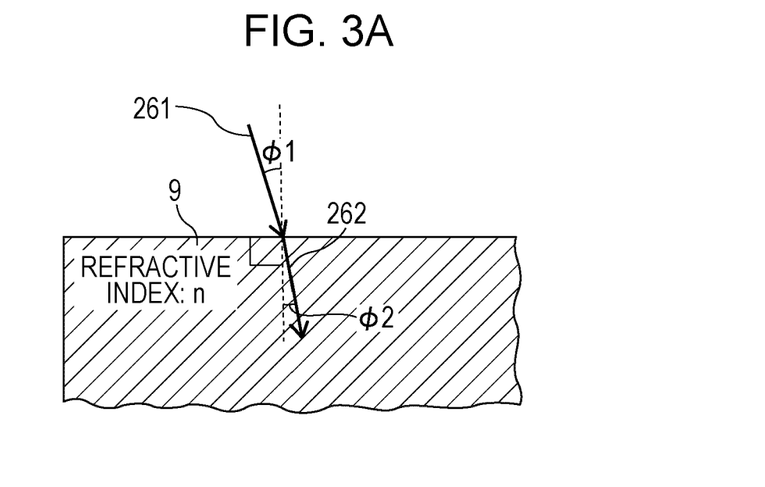
FIGS. 3A and 3B are schematic sectional views each illustrating an inclination of a light beam in a reduction-projection-exposure process.

When the light ray 261 having an inclination angle (incident angle) $\phi 1$ is incident on the ejection orifice forming member 9 on the element substrate as illustrated in FIG. 3A and the refractive index of air is assumed to be 1, an ejection orifice formed by patterning has an inclination angle $\phi 2$ that is represented as follows:

$$\phi 2 \approx \phi 1 / n,$$

where n is the refractive index of the photosensitive resin material of the ejection orifice forming member 9.

Figure 3B:
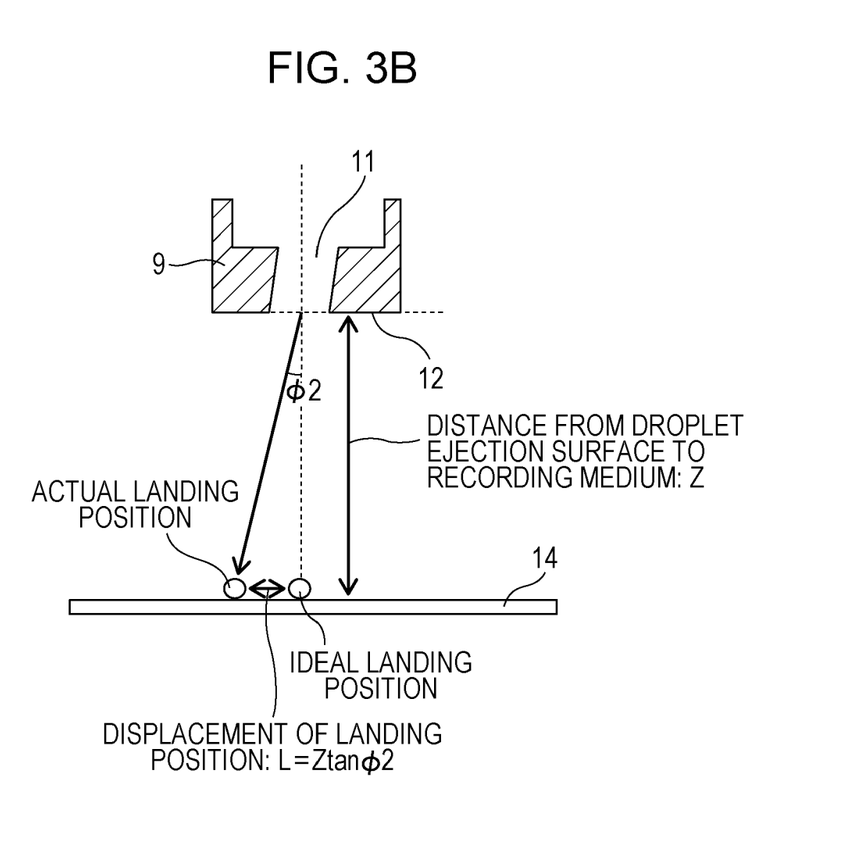

As illustrated in FIG. 3B, when a droplet is ejected from one of the ejection orifices 11, which has been formed by a light ray 262 having the inclination angle $\phi 2$, the droplet is ejected at the inclination angle $\phi 2$ with respect to a direction perpendicular to an ejection surface 12. Therefore, the droplet lands on a recording medium 14 at a position displaced from an ideal landing position. The displacement L of the landing position can be represented as follows:

$$L = Z \tan \phi 2,$$

where Z is the distance from the ejection surface 12 to the recording medium 14.

Figure 4:
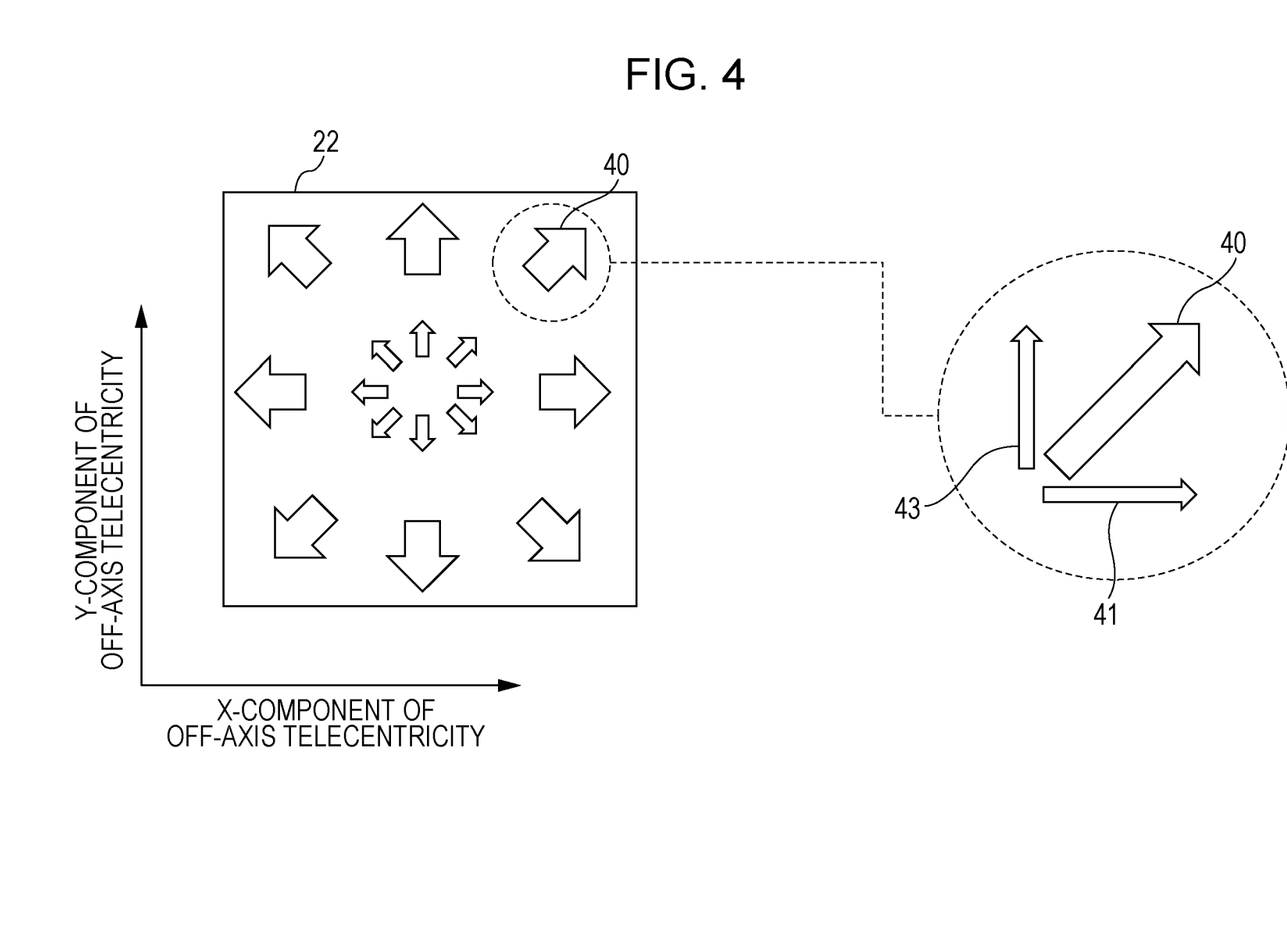
FIG. 4 is a conceptual diagram illustrating off-axis telecentricity that occurs on an exposure mask.

FIG. 4 is a conceptual diagram illustrating the off-axis telecentricity of the light beam 20 that is incident on the mask 22 of the reduction-projection-exposure apparatus. In FIG. 4, the size of an arrow represents the absolute value of off-axis telecentricity, and the direction of the arrow represents a direction in which the off-axis telecentricity occurs. As described above, the absolute value of off-axis telecentricity tends to increase with increasing distance from the center of the mask 22 (the center of the light beam 20) toward an outer periphery of the mask 22. In this case, off-axis telecentricity occurs in a direction from the center of the mask 22 toward the outer periphery of the mask 22. However, with some type of exposure apparatus, off-axis telecentricity occurs in a direction from the outer periphery of the mask 22 toward the center of the mask 22. The direction depends on the structure of the exposure apparatus. The present invention can be applied to exposure apparatuses of any of these types. In a right-side portion of FIG. 4, off-axis telecentricity 40 that occurs in the vicinity of an end portion of the mask 22 is illustrated. The off-axis telecentricity 40 has an X-component 41 and a Y-component 43.

Next, an exposure correction mechanism according to an embodiment of the present invention will be described. The exposure correction mechanism corrects a chief ray that is inclined due to off-axis telecentricity so that the chief ray can be perpendicularly incident on a surface of the nozzle chip 1. In other words, the correction mechanism suppresses an inclination of the chief ray relative to the optical axis in a reduction-projection-exposure process.

The exposure correction mechanism can be formed on the mask 22. Alternatively, the exposure correction mechanism may be formed by processing the mask 22 so that the mask 22 can correct the off-axis telecentricity of a chief ray passing therethrough. In this case, the mask 22 also serves as the exposure correction mechanism. Further alternatively, an exposure correction mechanism may be independently disposed in the reduction-projection optical system 23, or an optical element already disposed in the reduction-projection optical system 23 may be processed so as to function as an exposure correction mechanism. Note that, in the case of disposing the exposure correction mechanism in the reduction-projection optical system 23, it is necessary to consider the influence of such a structure on the optical characteristics other than off-axis telecentricity.

Figure 5:
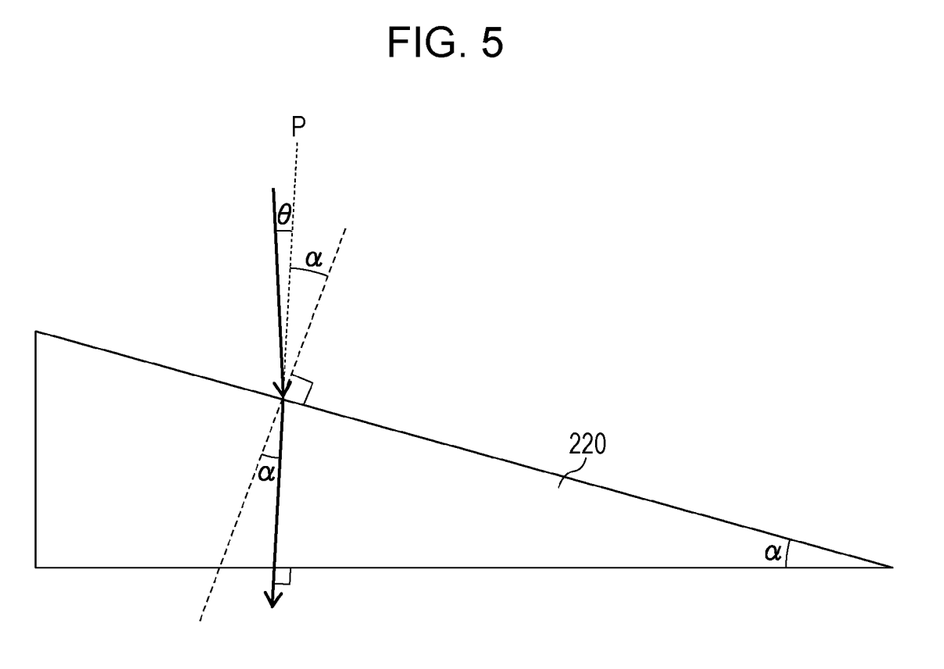
FIG. 5 is a schematic sectional view illustrating exposure light incident on a correction mechanism for correcting off-axis telecentricity.

An example of an exposure correction mechanism is an exposure correction member having an inclined surface that is suitable for suppressing off-axis telecentricity (see FIG. 5). As illustrated in FIG. 5, an exposure light beam has an angle θ with respect to a direction P perpendicular to a surface of the nozzle chip 1 (direction of the optical axis of the reduction-projection optical system 23), and an exposure correction member 220 has an inclination angle α. The exposure correction member 220 has a refractive index N. In this case, if light that is incident on the exposure correction member 220 from air (having a refractive index of 1) is refracted in the direction P, which is perpendicular to the surface of the nozzle chip 1, the following relationship exists.

$$\sin(\theta+\alpha) = N \sin \alpha$$

Because the angles θ and α are small, the following approximate relationship exists between θ and α.

$$\theta + \alpha \approx N\alpha$$

$$\alpha \approx \theta/(N-1)$$

The absolute value of off-axis telecentricity, which depends on the exposure area and the reduction ratio of projection, is a very small value, such as a value in the range of several nanometers to several tens of nanometers per a defocus of 1 μm. This can be converted into an inclination θ of the chief ray of 1° to 2° at the maximum. For example, in a case where the exposure correction member 220 is formed on the mask 22 for a chief ray having an incident angle (θ) of 2°, the inclination angle α is about 4.0° if the refractive index of the exposure correction member 220 is 1.5.

As described above, off-axis telecentricity increases with increasing distance from the center of the mask 22 toward the outer periphery of the mask 22. Therefore, the inclination angle of the exposure correction member 220 may increase with increasing distance from the center of the mask 22 toward the outer periphery of the mask 22. In other words, the exposure correction member 220 may be a light-transmitting member having a gently curved surface that has a vertex located at the center of the chief ray and that has an inclination that increases with increasing distance from the center of the chief ray. In a case where off-axis telecentricity occurs toward the outer periphery of the mask, the curved surface is a concave surface. In a case where off-axis telecentricity occurs toward the center of the mask, the curved surface is a convex surface. The material and the method of making the exposure correction member 220 will be described in the embodiments below.

When making a nozzle chip, first, an element substrate, which includes energy generating elements that generate energy for ejecting a liquid from ejection orifices, is prepared. Next, a positive photosensitive resin layer including an optical absorption agent is formed on the element substrate. Then, the positive photosensitive resin layer is exposed to light by photolithography, and thereby a pattern having the shapes of flow paths is formed. Next, a photosensitive resin material layer, which will serve as an ejection orifice forming member, is formed so as to cover the pattern. The photosensitive resin material may be negative or positive.

Next, the photosensitive resin material is reduction-projection-exposed to exposure light through a mask by using the reduction-projection-exposure apparatus described above, the mask having a light-transmitting pattern formed thereon. The light-transmitting pattern formed on the mask corresponds to an ejection orifice pattern to be formed on the photosensitive resin material. Then, by performing a developing operation, the ejection orifice pattern corresponding to the light-transmitting pattern is formed on the photosensitive resin material. Subsequently, by removing the pattern through the ejection orifices, flow paths having predetermined shapes are formed in the ejection orifice forming member.

First Embodiment

The exposure correction mechanism according to the present invention may be provided in the reduction-projection optical system 23 or in the mask 22. FIGS. 6A to 6E illustrate a process of making an exposure correction mechanism according to a first embodiment of the present invention. In this embodiment, the exposure correction mechanism is disposed on the mask 22.

Figure 6A:
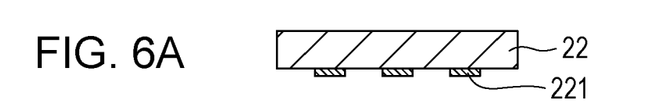
FIGS. 6A to 6F illustrate a process of making a correction mechanism according to a first embodiment.

FIG. 6A is a sectional view of the mask 22. For example, in a case where exposure light is i-line light, a quartz substrate can be used as the material of the mask 22. The exposure correction mechanism may be disposed on a correction mechanism forming surface 222 shown in FIG. 6B, which is a surface of the mask 22 opposite to a surface on which a mask pattern 221 is formed.

Figure 6B:
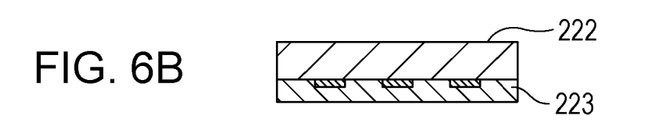
Figure 6C:
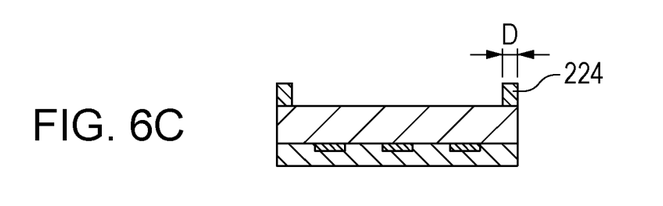

As illustrated in FIG. 6B, first, a mask pattern protecting layer 223 for protecting the mask pattern 221 is formed on the mask 22. The material of the mask pattern protecting layer 223 may be, for example, a PET film. The mask pattern protecting layer 223 is formed, for example, by using a known film lamination technology. Next, as illustrated in FIG. 6C, an inclination forming member 224 is formed on the correction mechanism forming surface 222 of the mask 22 by performing a patterning operation. The inclination forming member 224 may be formed at an appropriate position on a surface of the mask 22 opposite to a surface on which the mask pattern protecting layer 223 is disposed so that the inclination forming member 224 does not interfere with a pattern area of the mask 22 used for patterning.

Figure 7:
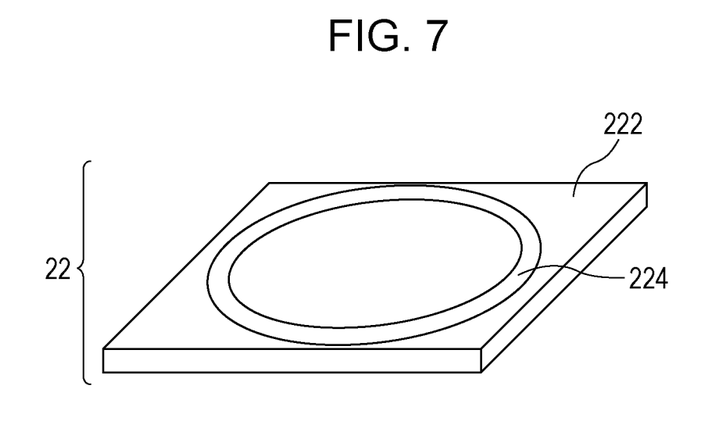
FIG. 7 is a schematic perspective view illustrating an example of a correction mechanism on the exposure mask.

FIG. 7 schematic perspective view of the mask 22 in the state shown in FIG. 6C. The off-axis telecentricity tends to increase concentrically from the center of the mask 22 toward the outer periphery of the mask 22. Therefore, the inclination forming member 224 may have an annular shape. Preferably, the inclination forming member 224 has a width D (see FIG. 6C) of 1 mm or less. The thickness of the inclination forming member 224 may be appropriately set in accordance with off-axis telecentricity, the exposure area, the reduction ratio, the size of the mask, and the like. As described above, $\alpha=4.0°$ when the incident angle $\theta$ of the chief ray is about 2° and the refractive index N of the material is about 1.5. With consideration that $\theta$ and N may deviate from these values, the allowable upper limit of $\alpha$ is about 5°. Then, preferably, the following relationship is satisfied:

$$H/X \leq \tan(\alpha) \approx 0.09,$$

where X is the distance from the center of the mask 22 to the inclination forming member 224 and H is the thickness of the inclination forming member 224.

Figure 6D:
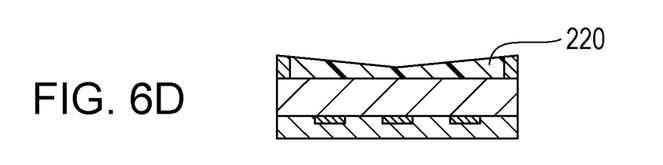

Next, as illustrated in FIG. 6D, the exposure correction member (correction mechanism) 220 is formed on the correction mechanism forming surface 222 of the mask 22. Examples of the material of the exposure correction member 220 include polymethyl isopropenyl ketone, which is a positive photosensitive resin. The exposure correction member 220 is formed by, for example, spin coating. However, the material of the exposure correction member 220 and the method of forming the exposure correction member 220 are not limited to these. Any appropriate material and any appropriate method may be used. The thickness of the exposure correction member 220 may be appropriately set in accordance with the thickness of the inclination forming member 224 and the transmittance of the material at the wavelength of exposure light. Preferably, the material of the exposure correction member 220 has an absorptance that is 10% or less at the wavelength of exposure light and a refractive index that is 1.3 or greater at the wavelength of exposure light. The exposure correction member 220, which is formed in the inclination forming member 224, has an inclination that increases with increasing distance from the center of the mask 22 toward the outer periphery of the mask 22. In other words, a surface of the exposure correction member 220 may have a shape like an inner surface of a mortar. In a case where the distribution of off-axis telecentricity is substantially rotationally symmetric about the optical axis of the reduction-projection optical system, the surface of the exposure correction member 220 may have a shape that is substantially rotationally symmetric about the optical axis. However, because the distribution of off-axis telecentricity in the exposure area differs between reduction-projection-exposure apparatuses, it is necessary to set the inclination, that is, the shape of the mortar-like shape and the curvature, in accordance with the distribution of off-axis telecentricity.

Figure 6E:
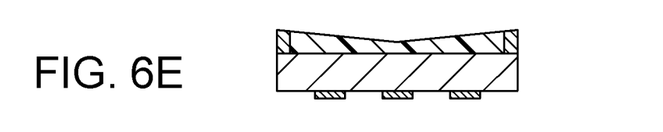
Figure 6F:
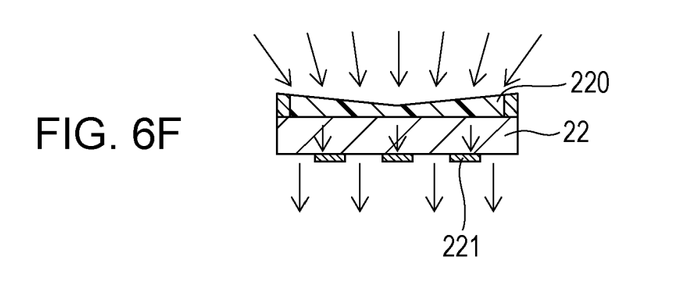

Next, as illustrated in FIG. 6E, the mask pattern protecting layer 223 is removed. FIG. 6F is a schematic view illustrating a state in which reduction-projection-exposure is performed by using the mask 22, on which the exposure correction member 220 has been formed through the steps described above. As illustrated in FIG. 6F, the inclination of the chief ray due to off-axis telecentricity is cancelled (reduced) by the exposure correction member 220, so that the exposure light can be perpendicularly incident on the entire exposure area. Thus, ejection orifices can be formed by patterning so that they extend more perpendicular than those formed without using the exposure correction mechanism. Therefore, droplets can be ejected from the ejection orifices more accurately because displacement of landing positions due to inclinations of ejection orifices is suppressed.

Second Embodiment

It often happens that a distribution of off-axis telecentricity locally has singular values in a specific exposure area. In the present invention, such singular and local off-axis telecentricity will be referred to as a "random component". FIGS. 8A to 8G illustrate a process of making on a mask an exposure correction mechanism, for suppressing the random component of off-axis telecentricity, according to a second embodiment of the present invention.

Figure 8A:
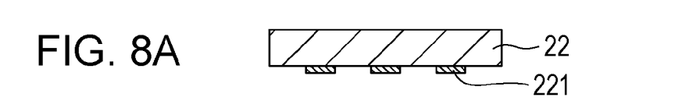
FIGS. 8A to 8H illustrate a process of making a correction mechanism according to a second embodiment.
Figure 8B:
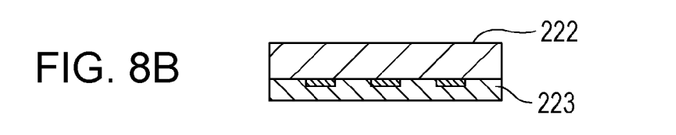
Figure 8C:
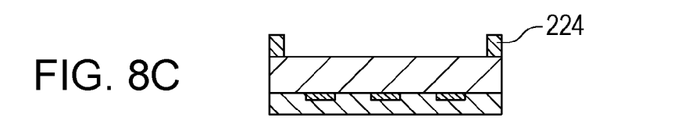
Figure 8D:
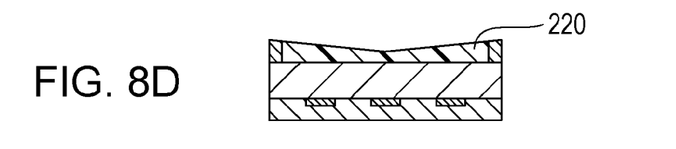
Figure 8E:
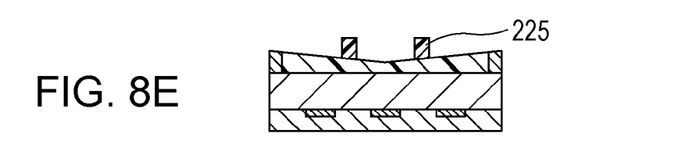
Figure 8F:
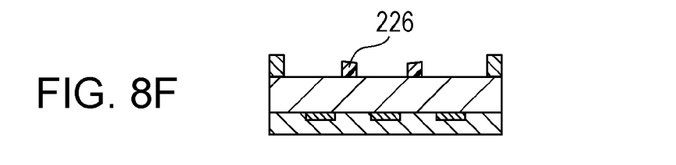

The steps illustrated in FIGS. 8A to 8D are performed in the same way as those of FIGS. 6A to 6D. Next, as illustrated in FIG. 8E, an exposure-correction-member protecting layer 225 is formed on a portion of the mask 22 corresponding to an exposure area in which the random component of off-axis telecentricity occurs. Next, etching is performed as illustrated in FIG. 8F so as to remove a portion of the exposure correction member 220 that is not located directly below the exposure-correction-member protecting layer 225. Thus, a local exposure correction member 226 is formed on the mask 22. The local exposure correction member 226 is formed, for example, by a method of wavelength separation that uses the difference in sensitivity to exposure light between the exposure correction member 220 and the exposure-correction-member protecting layer 225. When polymethyl isopropenyl ketone is used as the material of the local exposure correction member 226, for example, polymethyl methacrylate may be used as the material of the exposure-correction-member protecting layer 225. However, the method of making the local exposure correction member 226 is not limited to this. Any appropriate method can be used with consideration of the material and the characteristics of the exposure-correction-member protecting layer 225.

Figure 8G:
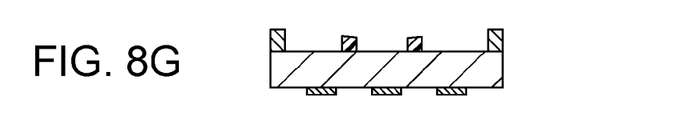
Figure 8H:
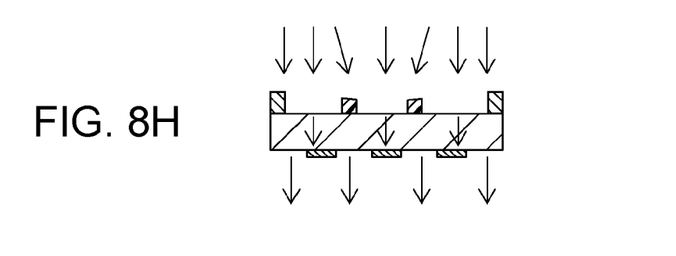

Next, as illustrated in FIG. 8G, the mask pattern protecting layer 223 is removed. FIG. 8H illustrates a state in which reduction-projection-exposure is performed by using the mask 22, on which the local exposure correction member 226 has been formed through the steps described above. As illustrated in FIG. 8H, the inclination of the chief ray due to the random component of off-axis telecentricity is cancelled (reduced) by the local exposure correction member 226, so that the exposure light can be perpendicularly incident on the entire exposure area.

Third Embodiment

Figure 9A:
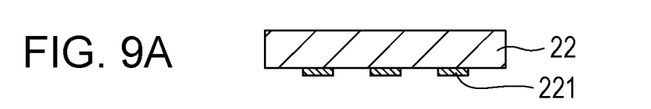
FIGS. 9A to 9G illustrate a process of making a correction mechanism according to a third embodiment.
Figure 9B:
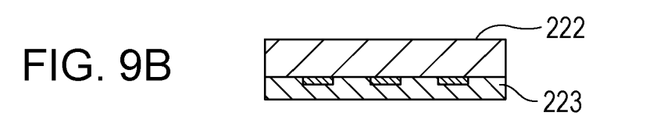
Figure 9C:
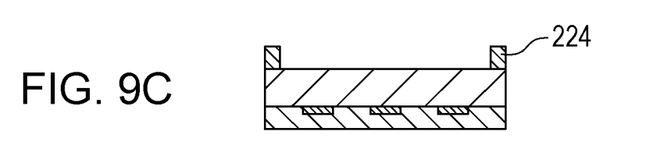
Figure 9D:
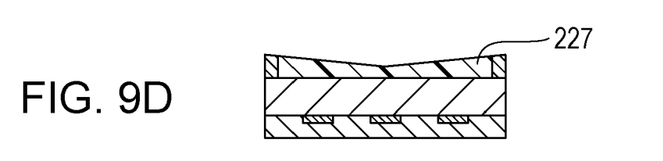

In the first and second embodiments, the exposure correction mechanism is included in an exposure correction member formed on a mask. Alternatively, the exposure correction mechanism may be formed by directly processing the mask. FIGS. 9A to 9F illustrate a process of making the mask 22 according to a second embodiment of the present invention, which functions as an exposure correction mechanism. The steps illustrated in FIGS. 9A to 9C are performed in the same way as those of FIGS. 6A to 6C. Next, as illustrated in FIG. 9D, an exposure-correction-portion processing layer 227 is formed on a region of the mask 22 surrounded by the inclination forming member 224. For example, the exposure-correction-portion processing layer 227 may be formed by performing a spin coating method using a polyether amide resin. However, the material of the exposure-correction-portion processing layer 227 and the method of forming the exposure-correction-portion processing layer 227 are not limited to these. Any appropriate material and any appropriate method may be used. The thickness of the exposure-correction-portion processing layer 227 may be appropriately set in accordance with the thickness of the inclination forming member 224 and the transmittance of the material at the wavelength of exposure light. Due to the presence of the inclination forming member 224, the exposure-correction-portion processing layer 227 has an inclination that increases with increasing distance from the center of the mask 22 toward the outer periphery of the mask 22. In other words, the exposure-correction-portion processing layer 227 has a shape like an inner surface of a mortar. However, because the distribution of off-axis telecentricity in the exposure area differs between reduction-projection-exposure apparatuses, it is necessary to set the inclination, that is, the shape of the mortar-like shape and the curvature, in accordance with the distribution of off-axis telecentricity.

Figure 9E:
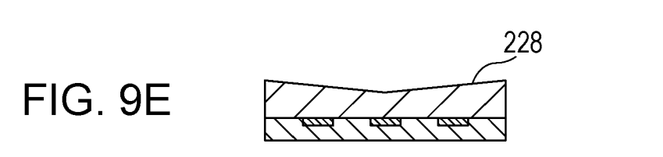

Next, as illustrated in FIG. 9E, the exposure-correction-portion processing layer 227 is dry-etched so as to form an exposure correction surface 228 on the mask 22. As the exposure-correction-portion processing layer 227 is uniformly removed by dry etching, the mask 22 becomes gradually exposed from the exposure-correction-portion processing layer 227, and the mask 22 is gradually etched through the exposed portions. Thus, the mask 22 is etched so as to have a shape corresponding to the shape of the surface of the exposure-correction-portion processing layer 227, and the exposure correction surface 228 is formed on a side of the mask 22 opposite to the side on which the mask pattern 221 is disposed, that is, on the correction mechanism forming surface 222 shown in FIG. 9B. As with the exposure-correction-portion processing layer 227, the exposure correction surface 228 is formed so as to have a shape like an inner surface of a mortar, which has an inclination that increases with increasing distance from the center of the mask 22 toward the outer periphery of the mask 22.

Figure 9F:
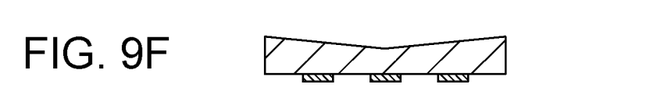
Figure 9G:
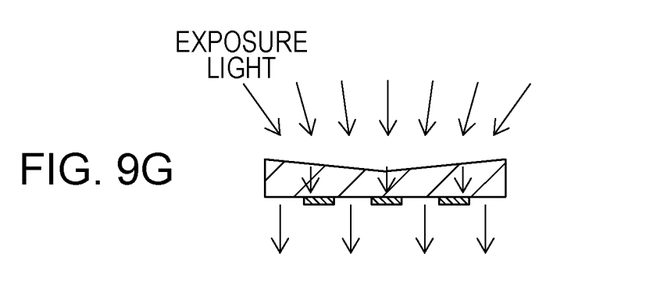

Next, as illustrated in FIG. 9F, the mask pattern protecting layer 223 is removed. FIG. 9G is a schematic view illustrating a state in which reduction-projection-exposure is performed by using the mask 22, on which the exposure correction surface 228 has been formed through the steps described above. As illustrated in FIG. 9G, the inclination of the chief ray due to off-axis telecentricity is cancelled (reduced) by the exposure correction surface 228, which is a surface of the mask 22 having an inclination, so that the exposure light can be perpendicularly incident on the entire exposure area.

The present invention is not limited to the embodiments described above, and may be modified in various ways within the spirit and scope of the present invention. The scope of the present invention is defined in the claims attached below.

With the present invention, inclinations of ejection orifices are suppressed, and therefore displacement of landing positions of droplets ejected from the ejection orifices can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-075802, filed Apr. 1, 2013, which is hereby incorporated by reference herein in its entirety.

What is claimed is:

1. A method of making a nozzle chip, the method comprising:
a step of reduction-projection-exposing a photosensitive resin material to exposure light through a mask by using a reduction-projection-exposure apparatus, the mask having a light-transmitting pattern formed thereon; and
a step of forming an ejection orifice pattern corresponding to the light-transmitting pattern on the photosensitive resin material by performing a developing operation,
wherein the exposure light in the step of reduction-projection-exposing is passed through a correction mechanism before the exposure light reaches the photosensitive resin material, the correction mechanism being configured to suppress an inclination of a chief ray due to off-axis telecentricity that occurs in the reduction-projection-exposure apparatus so the exposure light can be perpendicularly incident on the entire exposure area to form ejection orifices by patterning.

2. The method of making a nozzle chip according to claim 1, wherein the correction mechanism is included in a light-transmitting member disposed on the mask.

3. The method of making a nozzle chip according to claim 1, wherein the correction mechanism is included in the mask.

4. The method of making a nozzle chip according to claim 1, wherein the correction mechanism has an inclined surface having an inclination angle with respect to a surface onto which the exposure light is projected, the inclination angle increasing with increasing distance from a center of the mask toward an outer periphery of the mask.

5. The method of making a nozzle chip according to claim 2, wherein the correction mechanism has an inclined surface having an inclination angle with respect to a surface onto which the exposure light is projected, the inclination angle increasing with increasing distance from a center of the mask toward an outer periphery of the mask.

6. The method of making a nozzle chip according to claim 3, wherein the correction mechanism has an inclined surface having an inclination angle with respect to a surface onto which the exposure light is projected, the inclination angle increasing with increasing distance from a center of the mask toward an outer periphery of the mask.

7. The method of making a nozzle chip according to claim 1, wherein the correction mechanism suppresses an inclination of the chief ray due to a singular component of the off-axis telecentricity that locally occurs.

8. The method of making a nozzle chip according to claim 2, wherein the correction mechanism suppresses an inclination of the chief ray due to a singular component of the off-axis telecentricity that locally occurs.

9. The method of making a nozzle chip according to claim 3, wherein the correction mechanism suppresses an inclination of the chief ray due to a singular component of the off-axis telecentricity that locally occurs.

* * * * *